United States Patent [19]

Bernin

[11] 3,836,910

[45] Sept. 17, 1974

[54] SOLID STATE PHASE OUTPUT SWITCH WITH NOISE IMMUNITY AND DIAGNOSTIC CAPABILITIES

[75] Inventor: Victor M. Bernin, Mt. Prospect, Ill.

[73] Assignee: Illinois Tool Works Inc., Chicago, Ill.

[22] Filed: Mar. 27, 1973

[21] Appl. No.: 345,300

[52] U.S. Cl. ........ 340/365 L, 340/174 PM, 340/409
[51] Int. Cl. ........ H04l 15/06
[58] Field of Search ........ 340/365 L, 174 PM

[56] References Cited

UNITED STATES PATENTS

| | | | |
|---|---|---|---|
| 3,035,253 | 5/1962 | Devol | 340/365 L |
| 3,698,531 | 10/1972 | Bernin | 340/365 L |

*Primary Examiner*—Thomas B. Habecker
*Attorney, Agent, or Firm*—Olson, Trexler, Wolters, Bushnell & Fosse, Ltd.

[57] ABSTRACT

The embodiment of the invention disclosed herein is directed to a solid state switch having noise detection and diagnostic capabilities for use in switching systems. The switch includes first and second closed loop magnetic paths which are alternately rendered magnetically saturated and unsaturated so that a common phase signal from the associated drive and sense lines can be obtained at all times. Upon sensing the absence of a signal of either phase, automatic triggering means are provided to indicate the failure of operation of the switch.

11 Claims, 6 Drawing Figures

SOLID STATE PHASE OUTPUT SWITCH WITH NOISE IMMUNITY AND DIAGNOSTIC CAPABILITIES

BACKGROUND OF THE INVENTION

This invention relates generally to switch structures, and more particularly to solid state switch structures of the type having closed loop magnetic core members capable of being magnetically saturated and unsaturated as a result of the presence and absence of magnetic fields.

In the operation of electrical components it is often times necessary to test specific operability of components during the life of the equipment in which the component is installed. This includes testing of switches connected to electronic circuits, particularly computer circuits or space and aircraft vehicles where operability of such components can be critical. To test such components it is often necessary to shut the circuit and/or remove the component from the circuit to establish its effective operability under dynamic conditions in a piece of remotely located test equipment. This results in a loss of time and is rather expensive as it requires substantial man hours to perform the testing operation.

SUMMARY OF THE INVENTION

Accordingly, it is an object of this invention to provide a new and improved solid state switch structure which can be tested while still in an operative condition in a circuit.

Briefly, the solid state switching device of this invention incorporates phase sensing to detect the switching action. The phase type switch structure disclosed herein is capable of being diagnosed as to its operating condition, whether operating or not operating, while the switch is in operation without the necessity of actuating the switch and regardless of the position of the switch at the time of tests. By way of comparison, the condition of a normally open mechanical switch type contact cannot be determined unless the contacts are closed, and such a test would be valid only at the time of testing. Closing the contacts for reasons of testing the switch is quite often impractical, and sometimes impossible.

The basic principle of the phase solid state switching structure of this invention is that an output signal from the switch is present at all times. When the switch is actuated only the phase of the signal changes. Therefore, if the signal from the switch fails it is a positive indication that the switch is defective or the connecting lines which operate through the switch are open. This condition can be detected quite readily and on a continuous basis while the switch is in any of its positions in the circuit.

One embodiment utilizes two independent closed loop magnetic core members forming a balanced phase type switch which has a primary or drive winding as well as a secondary or sense winding passing through the cores. The two primary windings, one associated with each core, are connected in series aiding relationship while the two secondary windings are connected in series opposing relationship. Without the presence of a magnetic field adjacent one of the closed loop magnetic core members the output signal from the sense or secondary winding would cancel each other and provide a net zero output result.

When a magnetic field is placed adjacent one of the closed loop magnetic paths to saturate the same an off-balance condition exists so that in one position of the magnet, i.e., switch actuator, an output of the switch will have one phase or polarity and in the second position of the magnet or actuator the output of the switch will have the opposite phase or polarity. A defective switch is readily detected by the complete absence of output signals of either polarity.

The ferrite magnetic material used to form the closed loop magnetic core members is basicly a square law function material such that the incremental permeability decreases with increased drive of signals therethrough. Therefore, if the magnetic material is magnetically biased just near or just barely beyond the saturation point a signal applied thereto can have the effect of either driving the magnetic material to a further saturated condition, to have no effect, or to drive it out of saturation to allow transformer coupling of the signal to be seen at the output of the switch.

Another embodiment of the solid state switching structure of this invention utilizes a single core member having first and second closed loop magnetic core paths which operate independently of one another. Each path has a secondary winding associated with a corresponding secondary winding of the other magnetic path and are connected together as mentioned above with regard to discrete independent closed loop magnetic core members. In the single intregal embodiment switching is accomplished by saturating one magnetic path and unsaturating the other.

The phase switch of this invention has excellent diagnostic capabilities since a signal must be present at all times at the output of the switch. The disappearance of such a signal will indicate a defective switch circuit which can be immediately corrected. For example, the failure of an output signal will indicate such defects as, for example, loss of drive signal, loss of magnetic or magnet flux, defective or broken closed loop magnetic core members, open or shorted windings, open or shorted interconnecting lines, and the like.

Many other objects, features, and advantages of this invention will be more fully realized and understood from the following detailed description when taken in conjunction with the accompanying drawings wherein like reference numerals throughout the various views of the drawings are intended to designate similar elemenets or components.

DETAILED DESCRIPTION OF THE ILLUSTRATED EMBODIMENTS

Figure 1:
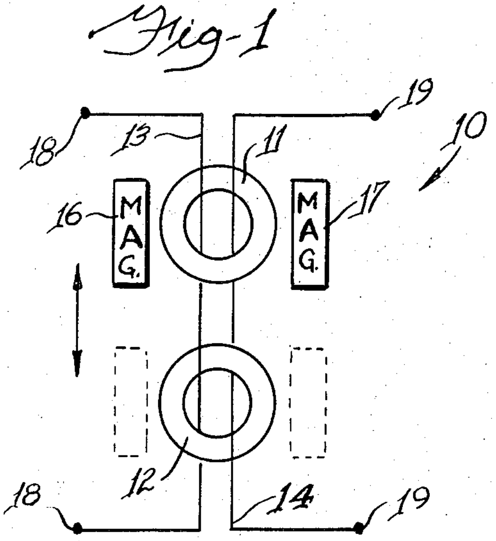
FIG. 1 is a diagrammatic representation of a solid state switch structure constructed in accordance with the principles of this invention.

Referring now to FIG. 1 there is seen a solid state phase sensing switch which has inherent noise immunity and diagnostic capabilitites and is designated generally by reference numeral 10. The solid state switch 10 includes first and second closed loop magnetic paths 11 and 12, here being formed by discrete spaced apart closed loop magnetic core members. The closed loop magnetic paths can be formed by core members of toroidal, rectangular, or oval configuration. Passing through the closed loop magnetic core members 11 and 12 are drive and sense lines 13 and 14, respectively. The drive line 13 is connectable, via terminals 18, to a source of signal information such as pulsating unipolar or bipolar pulses, or sine wave signal information. The sense line 14 is connected by means of terminals 19 to a suitable utilization circuit which senses the presence of pulse signal information, and produces a warning or indicating signal when the pulse signal information ceases to exist, thereby indicating a defective switch or switch circuit.

Movable magnet means are positioned adjacent one of the closed loop magnetic core members at a time to saturate the same while the other closed loop magnetic core member remains unsaturated. In the embodiment shown in FIG. 1 the magnet means is illustrated as a pair of permanent magnets 16 and 17 placed on opposite sides of the closed loop magnetic core member 11. The broken lines indicate the alternate positions of the magnets 16 and 17 as they are moved in the direction as indicated by the double ended arrow line adjacent magnet 16.

Figure 2:
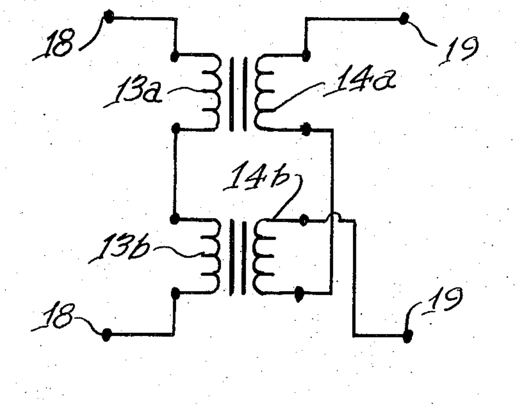
FIG. 2 is a schematic electrical equivalent of the switch structure of FIG. 1.

Referring now to FIG. 2 a schematic equivalent configuration of the electrical circuit is illustrated to show the operation of the switch of FIG. 1. Here the drive line 13 is illustrated as a pair of primary windings 13*a* and 13*b* connected in series one with the other and arranged to provide aiding voltages across the output terminals 18. For example, if a 10 volt pulse is applied across terminal 18 the windings 13*a* and 13*b* are phased to provide a 5 volt drop across each of the windings. The sense line 14 is illustrated by secondary windings 14a and 14b and are shown connected in opposing phase relation one with the other. Therefore, transformer coupling of signal information to both windings *a* and *b* simultaneously from their associated primaries 13*a* and 13*b* will produce a zero output voltage at terminals 19. However, when one of the closed loop magnetic paths 11 or 12 is saturated the output derived from transformer coupling between primaries 13*a* and 13*b* and secondaries 14*a* and 14*b* is eliminated. Therefore, transformer coupling of only one of the sense and drive lines units are obtained. For example, saturation of closed loop magnetic path 11 will eliminate transformer coupling at output winding 14*a* and the output of 14*b* will produce a negative 5 volts across terminals 19. On the other hand, saturation of closed loop magnetic path 12 will eliminate output from secondary winding 14*b* and produce a positive 5 volt output across terminals 19. If the switch fails for any reason output signals from the sense windings 14*a* and 14*b* will produce substantially a zero output across terminal 19 to indicate such failure. If the switch is actuated in one of the positions to produce an output signal, either negative or positive, and the other of the closed loop magnetic paths fails, the testing of the switch, actuation thereof will indicate such failure.

Figure 4:
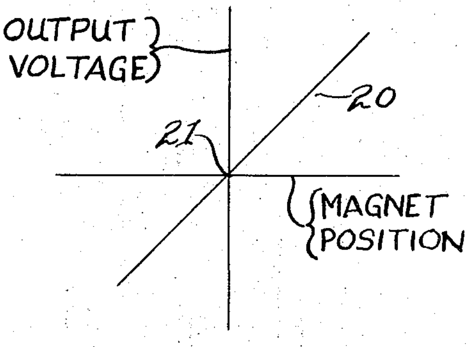
FIG. 4 is a graphical representation showing the output signal characteristic curve of the switch structure of this invention.

The general characteristic curve or magnetic position of magnets 16 and 17 relative to their associated closed loop magnetic paths 11 and 12 verses the voltage output across terminals 19, as shown in FIG. 4. The linear curve 20 indicates positive and negative voltage output signals obtainable at positions where an imbalanced condition exists between the closed loop magnetic paths 11 and 12. When a balanced condition exists, either no magnetic field at all at either one of the paths, or when they are equally saturated as a result of transverse movement of the magnet from one position to another, a zero output is provided at terminal 19, this being indicated at the crossover point 21 of FIG. 4.

Figure 3:
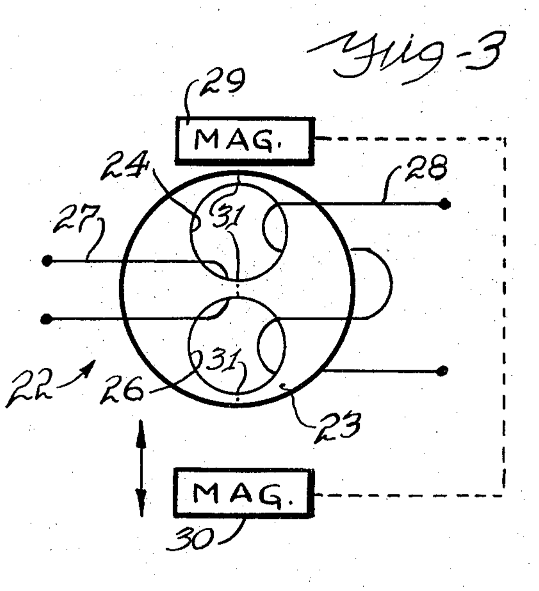
FIG. 3 is an alternate embodiment of the switch structure utilizing a single integrated core member providing first and second closed loop magnetic paths.

Referring now to FIG. 3 an alternate embodiment of the present invention is illustrated and designated generally by reference numeral 22. The solid state phase switch 22 includes a single unitary structure 23 having a pair of spaced apart apertures 24 and 26 formed therein. The unit 23 is made ferrous magnetic material which can be molded or readily formed in the configuration shown. A drive line 27 passes through each of the openings 24 and 26 and functions substantially in the same manner as the drive line 13 passing through separate cores 11 and 12. A sense line 28 is woven first through the opening 24 about the outer periphery of the member 23 and then again through the opening 26, this being in the opposite direction. A pair of magnets 29 and 30 are located on opposite sides of the magnetic member 23 and placed in close registry with the periphery of the magnet in an area of the openings 24 and 26. The magnets 29 and 30 are ganged together to move in unison as a result of actuation of a common actuator. The magnet 29, as seen, saturates the closed loop magnetic path about the aperture 24 to eliminate output signals therefrom to sense line 28. However, magnet 30 is sufficiently displaced from the closed loop magnetic path 26 to allow transformer coupling of pulse signal information from the drive line 27 to the sense line 28 in the region of the aperture 26. This configuration operates substantially in the same manner as that shown in FIG. 1 and will have substantially the same electrical configuration as shown in FIG. 2. To insure that failure of the structure 23 will occur through the entire structure if it occurs at all severed lines 31 are formed along the core. These severed lines may take many forms such as indentations formed in the structure when molded or grooves machined or scratched in the structure after the molding operation.

Figure 5:
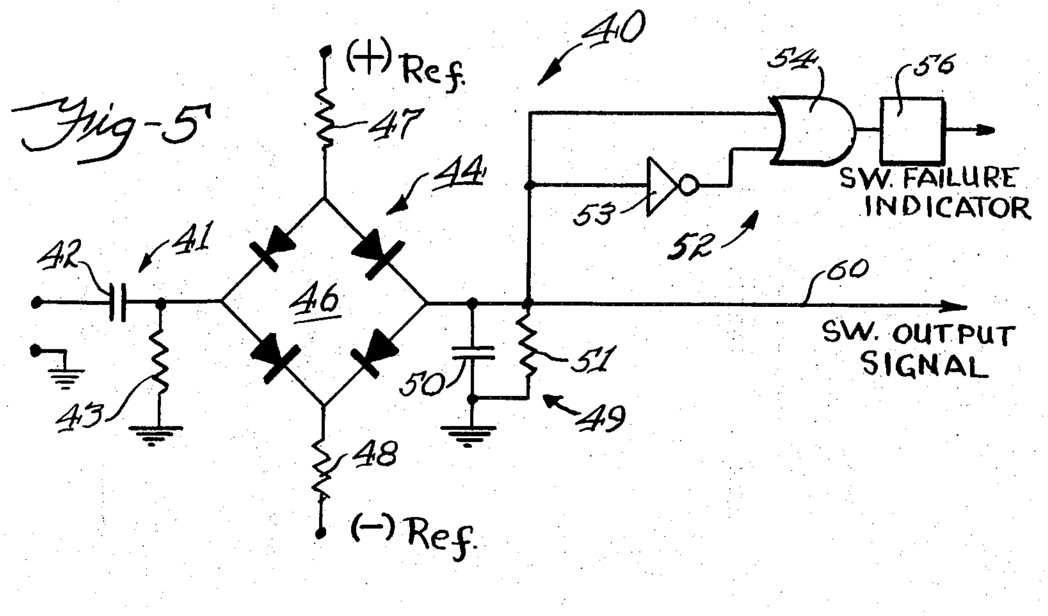
FIG. 5 illustrates a schematic circuit for providing detection of the absence of output signals to indicate a defective switch.

FIG. 5 illustrates a circuit arrangement to be connected to output terminals of either switch structures illustrated herein and is designated generally by reference numeral 40. The synchronous circuit 40 includes a high-pass input filter network 41 comprising a series capacitor 42 and a resistor 43 which serve to eliminate extraneous signals of lower frequencies than that provided by the signal information being transformer coupled between drive and sense lines. The output of the filter circuit 41 is connected to a phase detector circuit 44 which provides means for sychronous phase detecting of signals of either polarity provided at the output of the switch structure. In this instance the phase detector 44 includes a bridge circuit 46 having the opposite legs connected through resistors 47 and 48 to positive and negative, respectively, synchronized pulses which gate passage of the applied pulses through the bridge circuit. The selected positive or negative pulses through the phase detector 44 are then applied to a smoothing filter circuit 49 comprising a capacitor 50 and a parallel connected resistor 51. The output of the filter circuit is then delivered to a switch failure detector circuit 52 comprising an invertor network 53 for inverting the signal and applying it to one of the inputs of a gate circuit 54 while the second input of the gate circuit 54 receives the signal in the uninverted condition. Output of the gate circuit 54 is connected to a time delay circuit 56 which functions to provide a sufficient time delay of the indicating means so that space between pulses will not produce erroneous indications that the switch has failed. The pulses, either positive or negative, which are to be used to actuate function devices can be delivered to a multiplexing system over a line 60.

Figure 6:
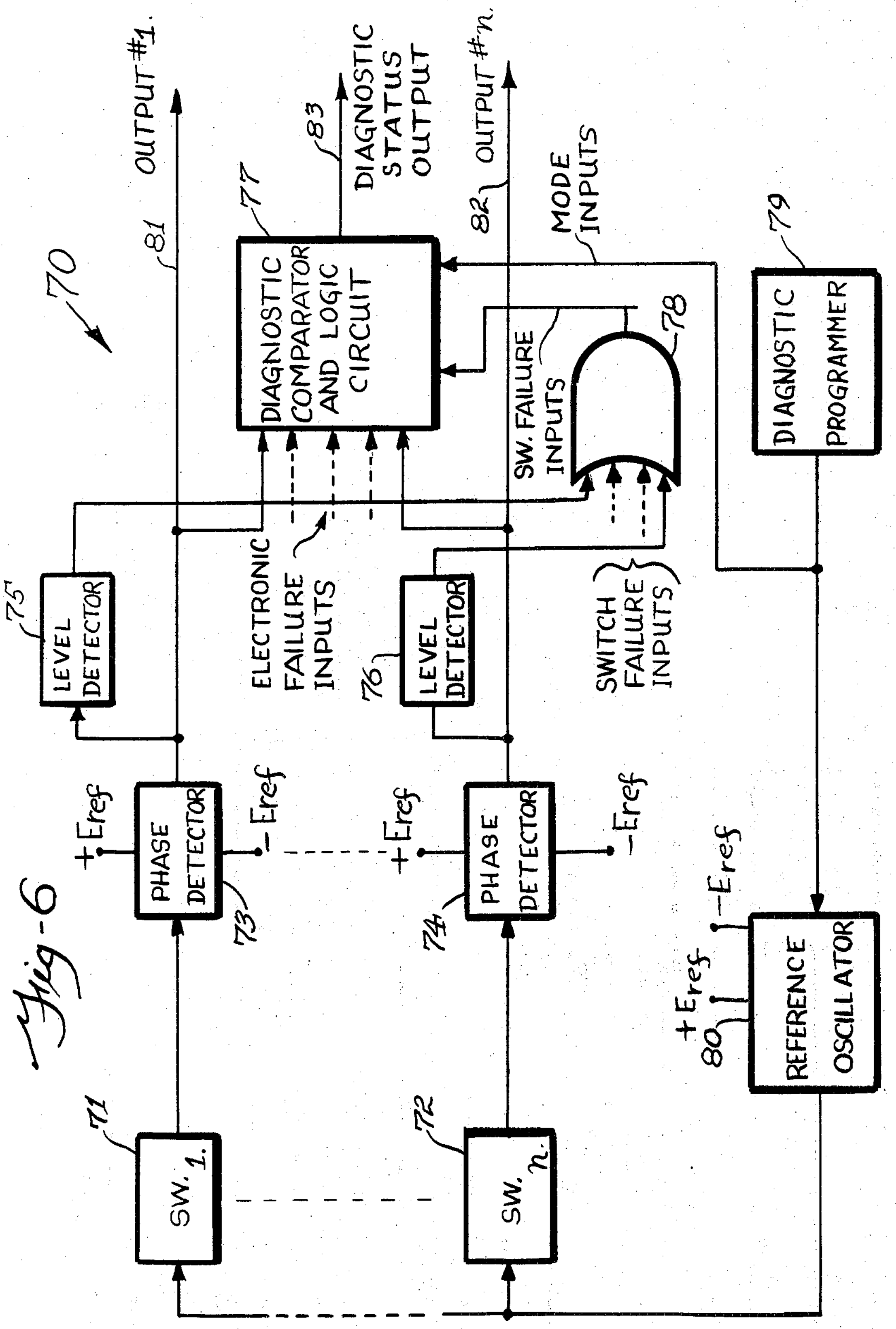
FIG. 6 illustrates an improved diagnostic system constructed in accordance with the principles of this invention.

Referring now to FIG. 6 there is seen a diagnostic system wherein the switches of this invention can be utilized and is designated generally by reference numeral 70. It will be understood that the diagnostic switches of this invention can also be used as sensors or the like and therefore, a plurality of switching devices and sensors can be connected to the system for continuous monitoring. This system can be used in such things as aircraft, spacecraft, and automobiles.

The purpose of the diagnostic system 70 is to detect a switch or sensor failure and/or a defective interconnection of the lines in the electronic circuitry. Also the system will detect failure of electronic components other than the solid state switching devices. The switch and sensor elements are here illustrated diagrammatically by reference numerals 71 and 72 and can take either one of the forms illustrated herein. That is, the electronic switches 71 and 72 are unique ferrite core switch elements which require a drive or excitation voltage, and whose output signal is a constant amplitude signal which only has a change in phase when the switch is actuated.

The signal from the switch or sensor units 71 and 72 are connected to phase synchronous detector circuits 73 and 74, respectively, which may correspond to the phase detectors 44 of FIG. 5. The output of the phase detectors 73 and 74 is a bipolar signal, each polarity corresponding to one phase of the switch signal, or switch position. The output of the phase detector for purposes of explanation will be considered the output of the control system to which the testing circuitry is connected as will be described. The phase detector output is connected to a level detector circuit 75 and 76 which indicates the absolute presence of a signal regardless of its phase and therefore also indicates the absence of any signal. This will indicate the failure of the switch or the failure of the interconnection, either or shorted of the drive and sense line, as well as other conductors in the circuit.

The reference signal applied to the phase detectors 73 and 74 is developed by a reference signal oscillator 80 which can be programed in such a manner that indications such as opened, closed, defective, and normal interconnection lines can be simulated to provide a visual readout of these conditions. The reference signal amplitude applied to the switching devices for test must exceed the phase detector input signal to give the proper indication. If the reference oscillator is programmed as shown by the following table the output from the phase detector will be as indicated.

TABLE 1

| Mode | Eref | −Eref | Condition | Phase Detector |
|---|---|---|---|---|
| 1 | on | on | normal | ± |
| 2 | off | on | switch on | − |
| 3 | on | off | switch off | + |
| 4 | off | off | switch defective | 0 |

These outputs are coupled to a diagnostic logic unit 77 and if the coutput of the phase detectors correspond to the mode of the reference signal oscillator the electronics unit will have been checked out and shown to be operable. This can be done by having indicating lights all green, and red lights indicating a defective condition. It also can be indicated by meters or strip chart recorders. This diagnostic system allows for checking of a plurality of switches, sensors, and their associated circuits and indicates which of these circuits has a defective component or line. The programming of the diagnostic programmer 79 can be accomplished either manually or automatically. The diagnostic system of 70 therefore, delivers to utilization means usable signal information along utilization lines 81 and 82 which will function in response to the actuation of switches or sensors 71 and 72. The indicating signal from the diagnostic comparitor logic circuit 77 is delivered along line 83, and as mentioned above can be used to energize the light indicating system or the like. It will be noted that a gating circuit 77 is provided to have a plurality of inputs thereof connected to the level detector output circuits 75 and 76 to deliver information to the diagnostic logic unit 77 when one of the switches is defective. The normal signal information to the diagnostic logic unit 77 is delivered from utilization lines 81 and 82. While only two discrete switch and phase detector units are illustrated it will be understood that a multitude of such switches and phase detectors can be incorporated in a single system and all function substantially in the same manner as disclosed herein.

While several embodiments of the present invention have been illustrated herein it will be understood that still further variations and modifications may be effected without departing from the spirit and scope of the novel concepts disclosed and claimed herein.

The invention is claimed as follows:

1. In a solid state switch construction the combination including: means providing first and second closed loop magnetic paths selectively to be magnetically saturated and unsaturated as a result of the presence and absence, respectively, of a magnetic field, drive line means passing through said closed loop magnetic paths for delivering thereto drive signals, sense line means passing through said closed loop magnetic paths and capable of receiving signal information from said drive line means as a result of transformer coupling from the drive line associated with the closed loop magnetic path which is in the magnetically unsaturated state, magnet means for selectively magnetically saturating said first closed loop magnetic path during one instance while magnetically unsaturating said second closed loop magnetic path, and magnetically saturating said second closed loop magnetic path during a second instance while unsaturating said first closed loop magnetic path, and circuit means connected to said sense line for detecting the total absence of pulse signal information on said sense line, whereby failure of signal information of either polarity on said sense line will indicate a malfunction of said solid state switch structure.

2. The solid state switch structure according to claim 1, wherein said drive line means passing through said first and second closed loop magnetic paths is connected in series aiding, said sense line means passing through said first and second closed loop magnetic paths is connected in series subtracting such that magnetic equilibrium of said first and second closed loop magnetic paths produces substantially zero output from said sense line when both said first and second closed loop magnetic paths are unsaturable.

3. The solid state switch structure according to claim 1, wherein said first and second closed loop magnetic paths are formed of discrete closed loop magnetic core members spaced apart from one another.

4. The solid state switch structure according to claim 1, wherein said first and second closed loop magnetic paths are formed in a single common magnetic core member having a pair of apertures therethrough and forming the two closed loops.

5. The solid state switch structure according to claim 1, further including phase detector means coupled to said sense line and including polarity phasing signals to pass only pulse signal information corresponding to the polarity phasing signals and rejecting all other signals.

6. The solid state switch structure according to claim 5, further including reference oscillator means connected to said drive line for operating said switch in response thereto, said reference oscillator having first and second outputs of opposite polarity for connection to said phase detector means to operate the same in synchronization with said reference oscillator and for detecting the phase output of said sense line, indicator circuit means connected to the output of said circuit means for receiving therefrom normal signal information of either polarity and for receiving signal information indicating the failure of phase signals from said switch, and program means connected to said reference oscillator and said indicator to sequentially subject said solid state switch to a programmed interrogation of pulses to indicate normal, switch-on, switch-off, and switch-defective conditions.

7. A solid state switch and diagnostic system, comprising: means providing first and second closed loop magnetic paths selectively to be magnetically saturated and unsaturated as a result of the presence and absence, respectively, of a magnetic field, drive line means passing through said closed loop magnetic path for delivering thereto drive signals, sense line means passing through said closed loop magnetic paths and capable of receiving signal information from said drive line means as a result of transformer coupling from the drive line associated with the with the closed loop magnetic path which in the magnetically unsaturated state, magnet means for selectively magnetically saturating said first closed loop magnetic path during one instance while magnetically unsaturating said second closed loop magnetic path, and magnetically saturating said second closed loop magnetic path during aesecond instance while unsaturating said first closed loop magnetic path, phase detector means connected to said sense line for producing an output signal of positive and negative polarities depending upon the position of said magnets, a utilization line connected to the output of said phase detector for providing a signal to operate as a function initiating signal, level detector means connected to said line for detecting the presence of either positive or negative signals on said line, said level detector means providing an output signal corresponding to the total absence of either polarity of signals on said line, reference oscillator means connected to said drive line for operating said switch, said reference oscillator means being connected to said phase detector to provide synchronous signals of positive and negative polarities for detection of positive and negative pulses from said switch, indicator means connected to said utilization line and said level detector for sensing the presence of utilization pulses and signals indicating the absence of such utilization pulses, and programmer means connected to said indicator means and said reference oscillator to provide a series of diagnostic pulse signals sequentially to check if conditions of the system such as normal, switch-on, switch-off, and switch-defective indications.

8. The solid state switch and diagnostic system according to claim 7, wherein said drive line means passing through said first and second closed loop magnetic paths is connected in series aiding, said sense line means passing through said first and second closed loop magnetic paths is connected in series opposing such that magnetic equilibrium of said first and second closed loop magnetic paths produces substantially zero output from said sense line when both said first and second closed loop magnetic paths are unsaturated.

9. The solid state switch and diagnostic system according to claim 7, wherein said first and second closed loop magnetic paths are formed of discrete closed loop magnetic core members spaced apart from one another.

10. The solid state switch and diagnostic system according to claim 7, wherein said first and second closed loop magnetic paths are formed of a single common magnetic core member having a pair of apertures formed therethrough to provide separate closed loop magnetic paths about the interior of the said common magnetic core member.

11. The solid state switch and diagnostic system according to claim 7, wherein a plurality of switch structures having first and second closed loop magnetic paths are connected in the system and a corresponding pluraity of phase detectors are utilized for switch operation.

* * * * *